United States Patent
Nakaya

(10) Patent No.: US 7,439,527 B2
(45) Date of Patent: Oct. 21, 2008

(54) ION BEAM IRRADIATION APPARATUS

(75) Inventor: Makoto Nakaya, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 169 days.

(21) Appl. No.: 11/429,277

(22) Filed: May 8, 2006

(65) Prior Publication Data

US 2006/0289802 A1   Dec. 28, 2006

(30) Foreign Application Priority Data

May 24, 2005   (JP)   ............ P2005-150832

(51) Int. Cl.
   *G21K 5/10*   (2006.01)
(52) U.S. Cl. ............... 250/492.21; 250/491.1; 250/492.1
(58) Field of Classification Search ............ 250/492.21, 250/492.1–492.3, 491.1
   See application file for complete search history.

(56) References Cited

U.S. PATENT DOCUMENTS 6,559,461 B1   5/2003   Seo
6,740,894 B1 *   5/2004   Mitchell ............. 250/492.21
2006/0027763 A1 *   2/2006   Deak ............. 250/492.21

FOREIGN PATENT DOCUMENTS

| GB | 2386469 | 9/2003 |
|----|---------|--------|
| JP | 01289060 A | 11/1989 |
| JP | 10326590 A | 8/1998 |
| JP | 2003-110012 | 4/2003 |
| WO | WO 99/13488 | 3/1999 |

* cited by examiner

*Primary Examiner*—Jack I. Berman
*Assistant Examiner*—Andrew Smyth
(74) *Attorney, Agent, or Firm*—Finnegan, Henderson, Farabow, Garrett & Dunner LLP

(57) ABSTRACT

Three axes that are orthogonal to each other at one point are taken as an X-axis, a Y-axis and a Z-axis. An irradiation angle setting motor holds a holder, and sets an irradiation angle $\theta$ of an ion beam by rotating this holder around a center axis that is parallel to the X-axis. A Y-axis linear motor causes the holder and the irradiation angle setting motor to ascend and descent in the direction of the Y-axis. A Z-axis linear motor moves the holder, the irradiation angle setting motor and the Y-axis linear motor in the direction of the Z-axis. A control unit operation-controls synchronously the Y-axis linear motor and the Z-axis linear motor so that a substrate holding surface of the holder reciprocates and scans linearly along an S-axis that is parallel to the substrate holding surface and orthogonal to the X-axis.

8 Claims, 5 Drawing Sheets

ION BEAM IRRADIATION APPARATUS

The present application claims foreign priority based on Japanese Patent Application No. 2005-150832, filed May 24, 2005, the content of which is incorporated herein by reference.

BACKGROUND OF THE INVENTION

1. Technical Field

The present invention relates to an ion beam irradiation apparatus so constructed as to irradiate a substrate held by a substrate holding surface of a holder with an ion beam that travels in the horizontal direction. Particularly, the invention relates to means for controlling non-uniformity of ion implantation due to a divergent angle of the ion beam applied onto the substrate. This ion beam irradiation apparatus is, for example, an ion implantation apparatus.

2. Related Art

FIG. 4 shows a schematic side view of this type of related-art ion beam irradiation apparatus, showing an example of the constitution in which the substrate held by the holder is irradiated with the ion beam. An ion beam irradiation apparatus having the nearly similar structure to this structure has been disclosed in FIG. 13 in JP-A-2003-110012.

Three axes that are orthogonal to each other at one point are taken as an X-axis, a Y-axis and a Z-axis. Generally, an ion beam 58 traveling in the direction along the Z-axis is scanned in the direction along the X-axis by an electric filed or a magnetic field, and applied onto a substrate 54 held by a substrate holding surface 6 of a holder 4. The holder 4 is, for example, an electrostatic chuck. In this example, both the X-axis and the Z-axis are imaginary axes in the horizontal direction.

Further, as the ion beam 58, in place of the ion beam scanned in the direction along the X-axis, there is also an ion beam which is long in the shape of a strip from its base without scanning in the direction along the X-axis, and travels in the direction along the Z-axis.

In this specification, "direction along an axis" means a direction substantially parallel to its axis. Further, "substantially parallel" includes a parallel state.

This ion beam irradiation apparatus includes a counter-rotatable type of irradiation angle setting motor 14 which controls an irradiation angle $\theta$ of the ion beam 58 to the substrate holding surface 6 of the holder 4 supported by a rotation shaft 46 through a coupling member 48, that is, to a surface 56 of the substrate 54 by rotating the holder 4 around the rotation shaft 46 substantially parallel to the X-axis in the direction of an arrow A in FIG. 4; and an elevator unit 50 which causes the holder 4 supported by this motor 14 to ascend and descend in the direction along the Y-axis thereby to scan the substrate 54 for the ion beam 58.

When ion beam 58 irradiation processing for the substrate 54, for example, ion implantation processing is performed, the irradiation angle $\theta$ is usually set in a range of 0° to 60°. This irradiation angle $\theta$ is an angle made by a perpendicular line 62 to the substrate holding surface 6 and the traveling direction of the ion beam 58. For example, in the ion implantation apparatus, this angle is referred to as an implantation angle.

As described above, in the related-art ion beam irradiation apparatus, in case that the irradiation angle $\theta$ is set to an angle that is larger than 0°, the substrate 54 supported by the holder 4, in a tilting state in the irradiation direction of the ion beam 58 (that is, direction along the Z-axis), is scanned in the direction along the Y-axis.

However, in case that the substrate 54, in the tilting state in the irradiation direction Z of the ion beam 58, is scanned in the direction along the Y-axis, there is a problem that the density of the ion beam 58 applied onto the substrate 54 becomes non-uniform in the surface 56 of the substrate 54.

The cause of this problem will be described with reference to FIG. 5. In this figure, for convenience, the irradiation angle setting motor 14, the rotation shaft 46, the coupling member 48 and the elevator unit 50 are omitted.

The ion beam 58 that has passed through a beam slit 52 is applied toward the substrate holding surface 6 of the holder 4 arranged in a vacuum chamber (not shown), that is, the surface 56 of the substrate 54.

The substrate 54, by the reciprocating movement of a center $O_1$ on the surface 56 of the substrate 54 together with the holder 4 between a position $\alpha$ and a position $\gamma$, is scanned for the ion beam 58. In a position $\beta$, the center $O_1$ on the surface 56 of the substrate 54 coincides with the path of the ion beam 58 traveling in the direction along the Z-axis.

On the other hand, the ion beam 58 is applied in a state where it diverges to some extent in the direction along the Y-axis due to the space-charge effect. Here, the angle at which the ion beam 58 diverges in the direction along the Y-axis is referred to as a divergent angle $\xi$.

In case that the ion beam 58 is thus applied onto the surface 56 of the substrate 54 in the state where it diverges to some extent in the direction along the Y-axis, according to the distance L from an arbitrary point on the path of the ion beam 58 (for example, an exit point of the beam slit 52) to the surface 56 of the substrate 56, the size of the irradiation region of the ion beam 58 applied onto the surface 56 of the substrate 54 is different. Namely, as the distance becomes longer, the size of the irradiation region of the ion beam 58 applied onto the surface 56 of the substrate 54 becomes larger.

Specifically, the irradiation region of the ion beam 58 applied onto the surface 56 of the substrate 54 when the center $O_1$ on the surface 56 of the substrate 54 is in the position $\alpha$ is taken as $G_1$, the irradiation region of the ion beam 58 applied onto the surface 56 of the substrate 54 when the center $O_1$ on the surface 56 of the substrate 54 is in the position $\beta$ is taken as $G_2$, and the irradiation region of the ion beam 58 applied onto the surface 56 of the substrate 54 when the center $O_1$ on the surface 56 of the substrate 54 is in the position $\gamma$ is taken as $G_3$. In this case, among the area of the region $G_1$, the area of the region $G_2$ and the area of the region $G_3$, the relation of $G_1 < G_2 < G_3$ holds.

Regarding the density of the ion beam 58 applied onto the surface 56 of the substrate 54, as the area of the irradiation region of the ion beam 58 applied onto the surface 56 of the substrate 54 becomes larger, the density becomes lower; and as the area of the irradiation region of the ion beam 58 applied onto the surface 56 of the substrate 54 becomes smaller, the density becomes higher.

Therefore, in case that the substrate 54 is scanned in the direction along the Y-axis in the titling state in the irradiation direction of the ion beam 58, the distance L changes during irradiation processing of the ion beam 58 onto the surface 56 of the substrate 54. Therefore, a phenomenon is produced in which the density of the ion beam 58 applied onto the substrate 54 becomes non-uniform in the surface 56 of the substrate 54. In result, uniformity of ion implantation in the surface 56 of the substrate 54 worsens.

SUMMARY OF THE INVENTION

Therefore, it is an object of the invention to prevent, even in case that the substrate is scanned in the tiling state in the irradiation direction of the ion beam, the density of the ion beam applied onto the substrate from becoming non-uniform in the surface of the substrate.

However, the present invention need not achieve the above objects, and other objects not described herein may also be achieved. Further, the invention may achieve no disclosed objects without affecting the scope of the invention.

An ion beam irradiation apparatus according to a first aspect of this invention is so constructed as to scan, when three axes that are orthogonal to each other at one point are taken as an X-axis, a Y-axis and a Z-axis, in the direction along the X-axis, an ion beam traveling in the direction along the Z-axis, and applies the ion beam onto a substrate held by a substrate holding surface of a holder. This ion beam irradiation apparatus includes: an irradiation angle setting motor which holds the holder, and can set an irradiation angle of the ion beam with respect to the substrate holding surface by rotating the holder around a center axis that is substantially parallel to the X-axis; a Y-axis linear motor which supports the irradiation angle setting motor, and causes the holder and the irradiation angle setting motor to ascend and descend in the direction along the Y-axis; a Z-axis linear motor which supports the Y-axis linear motor, and moves the holder, the irradiation angle setting motor and the Y-axis linear motor in the direction along the Z-axis; and a control unit which operation-controls synchronously the Y-axis linear motor and the Z-axis linear motor so that the substrate holding surface of the holder reciprocates and scans linearly along an S-axis that is substantially parallel to the substrate holding surface and substantially orthogonal to the X-axis.

An ion beam irradiation apparatus according to a second aspect of the invention is so constructed as to scan, when three axes that are orthogonal to each other at one point are taken as an X-axis, a Y-axis and a Z-axis, in the direction along the X-axis, an ion beam traveling in the direction along the Z-axis, and applies the ion beam onto a substrate held by a substrate holding surface of a holder. This ion beam irradiation apparatus includes: an irradiation angle setting motor which holds the holder, and can set an irradiation angle of the ion beam with respect the substrate holding surface by rotating the holder around a center axis that is substantially parallel to the X-axis; a Z-axis linear motor which supports the irradiation angle setting motor, and moves the holder and the irradiation angle setting motor in the direction along the Z-axis; a Y-axis linear motor which supports the Z-axis linear motor, and causes the holder, the irradiation angle setting motor and the Z-axis linear motor to ascend and descend in the direction along the Y-axis; and a control unit which operation-controls synchronously the Z-axis linear motor and the Y-axis linear motor so that the substrate holding surface of the holder reciprocates and scans linearly along an S-axis that is substantially parallel to the substrate holding surface and substantially orthogonal to the X-axis.

An ion beam irradiation apparatus according to a third aspect of the invention is so constructed as to apply, when three axes that are orthogonal to each other at one point are taken as an X-axis, a Y-axis and a Z-axis, an ion beam that is long in the shape of a strip in the direction along the X-axis direction and travels in the direction along the Z-axis, onto a substrate held by a substrate holding surface of a holder. This ion beam irradiation apparatus includes: an irradiation angle setting motor which holds the holder, and can set an irradiation angle of the ion beam with respect to the substrate holding surface by rotating the holder around a center axis that is substantially parallel to the X-axis; a Y-axis linear motor which supports the irradiation angle setting motor, and causes the holder and the irradiation angle setting motor to ascend and descend in the direction along the Y-axis; a Z-axis linear motor which supports the Y-axis linear motor, and moves the holder, the irradiation angle setting motor and the Y-axis linear motor in the direction along the Z-axis; and a control unit which operation-controls synchronously the Y-axis linear motor and the Z-axis linear motor so that the substrate holding surface of the holder reciprocates and scans linearly along an S-axis that is substantially parallel to the substrate holding surface and substantially orthogonal to the X-axis.

An ion beam irradiation apparatus according to a fourth aspect of the invention is so constructed as to apply, when three axes that are orthogonal to each other at one point are taken as an X-axis, a Y-axis and a Z-axis, an ion beam that is linearly long in the shape of a strip in the direction along the X-axis direction and travels in the direction along the Z-axis, onto a substrate held by a substrate holding surface of a holder. This ion beam irradiation apparatus includes: an irradiation angle setting motor which holds the holder, and can set an irradiation angle of the ion beam with respect to the substrate holding surface by rotating the holder around a center axis that is substantially parallel to the X-axis; a Z-axis linear motor which supports the irradiation angle setting motor, and moves the holder and the irradiation angle setting motor in the direction along the Z-axis; a Y-axis linear motor which supports the Z-axis linear motor, and causes the holder, the irradiation angle setting motor and the Z-axis linear motor to ascend and descend in the direction along the Y-axis; and a control unit which operation-controls synchronously the Z-axis linear motor and the Y-axis linear motor so that the substrate holding surface of the holder reciprocates and scans linearly along an S-axis that is substantially parallel to the substrate holding surface and substantially orthogonal to the X-axis.

According to these ion beam irradiation apparatuses, the holder is linearly reciprocated and scanned so that the substrate holding surface of the holder is along the S-axis. Therefore, during irradiation processing of the ion beam onto the substrate held by the holder, while the distance from an arbitrary point on the path of the ion beam to the substrate holding surface of the holder, that is, to the surface of the substrate is kept substantially constant, the substrate held by the holder can be scanned in a tiling state in the irradiation direction of the ion beam.

It is preferable that the control unit operation-controls synchronously the Y-axis linear motor and the Z-axis linear motor so that: when the control unit causes the Y-axis linear motor to ascend along the Y-axis by the distance $\Delta y$, the relation of $\Delta z = \Delta y \tan \theta$ is satisfied or the relation mathematically equivalent to this relation is satisfied; and when the control unit causes the Y-axis linear motor to descend along the Y-axis by the distance $\Delta y$, the relation of $-\Delta z = \Delta y \tan \theta$ is satisfied or the relation mathematically equivalent to this relation is satisfied, in which $\theta$ represents an irradiation angle of the ion beam applied to the substrate, and $\Delta z$ represents distance by which the linear motor is moved along the Z-axis (The direction in which the ion beam travels is taken as a positive direction.).

According to the invention, while the distance from the arbitrary point on the path of the ion beam to the surface of the substrate is kept substantially constant, the substrate held by the holder can be scanned in the tiling state in the irradiation direction of the ion beam. Therefore, the area of the irradiation region of the ion beam applied onto the substrate becomes always substantially constant. Thus, it is possible to prevent the density of the ion beam applied onto the substrate from becoming non-uniform in the surface of the substrate. In result, uniformity of ion implantation in the surface of the substrate improves.

DETAILED DESCRIPTION OF THE INVENTION

Figure 1:
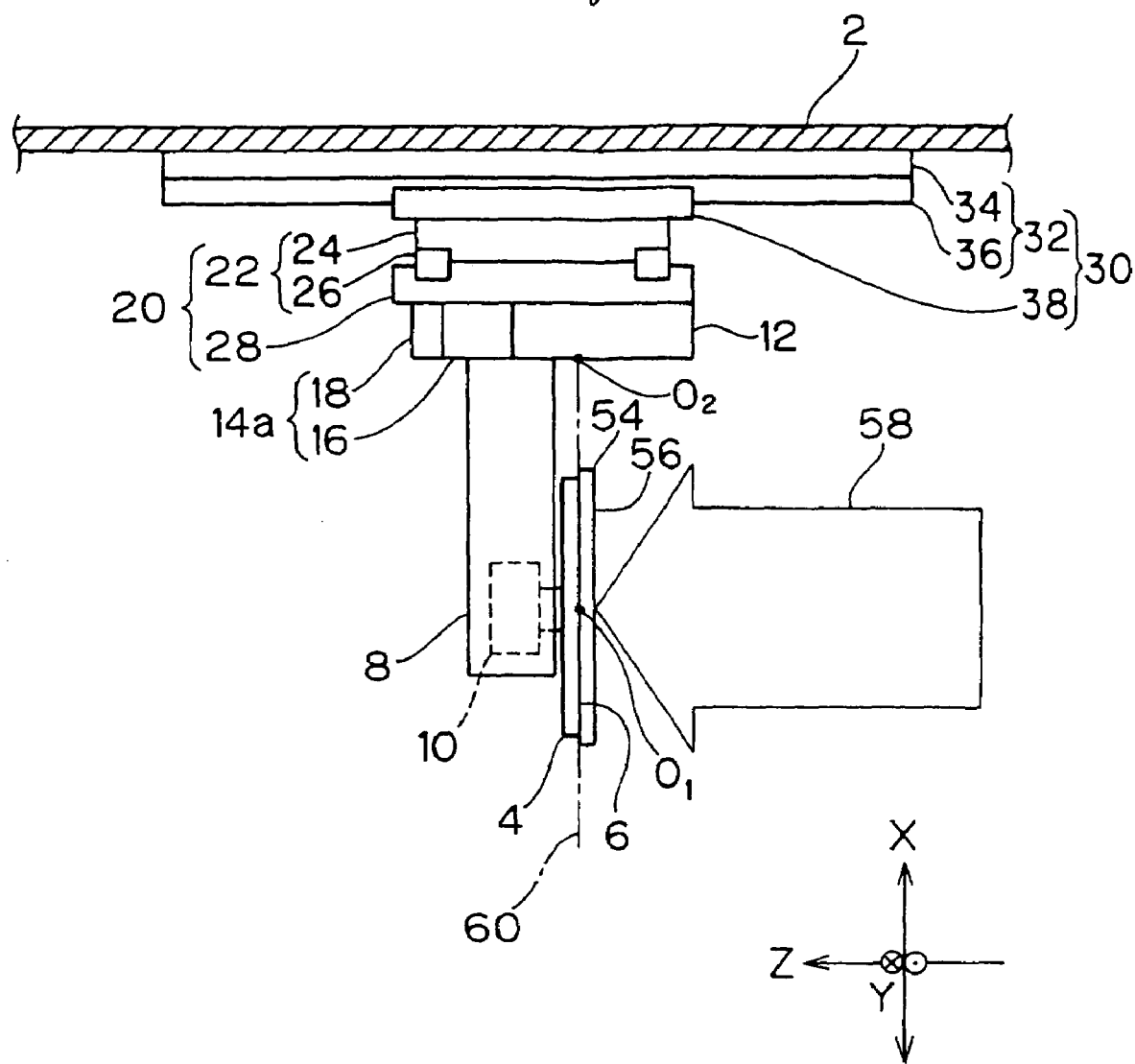
FIG. 1 is a schematic plan view showing one exemplary, non-limiting example of an ion beam irradiation apparatus according to the invention.
Figure 2:
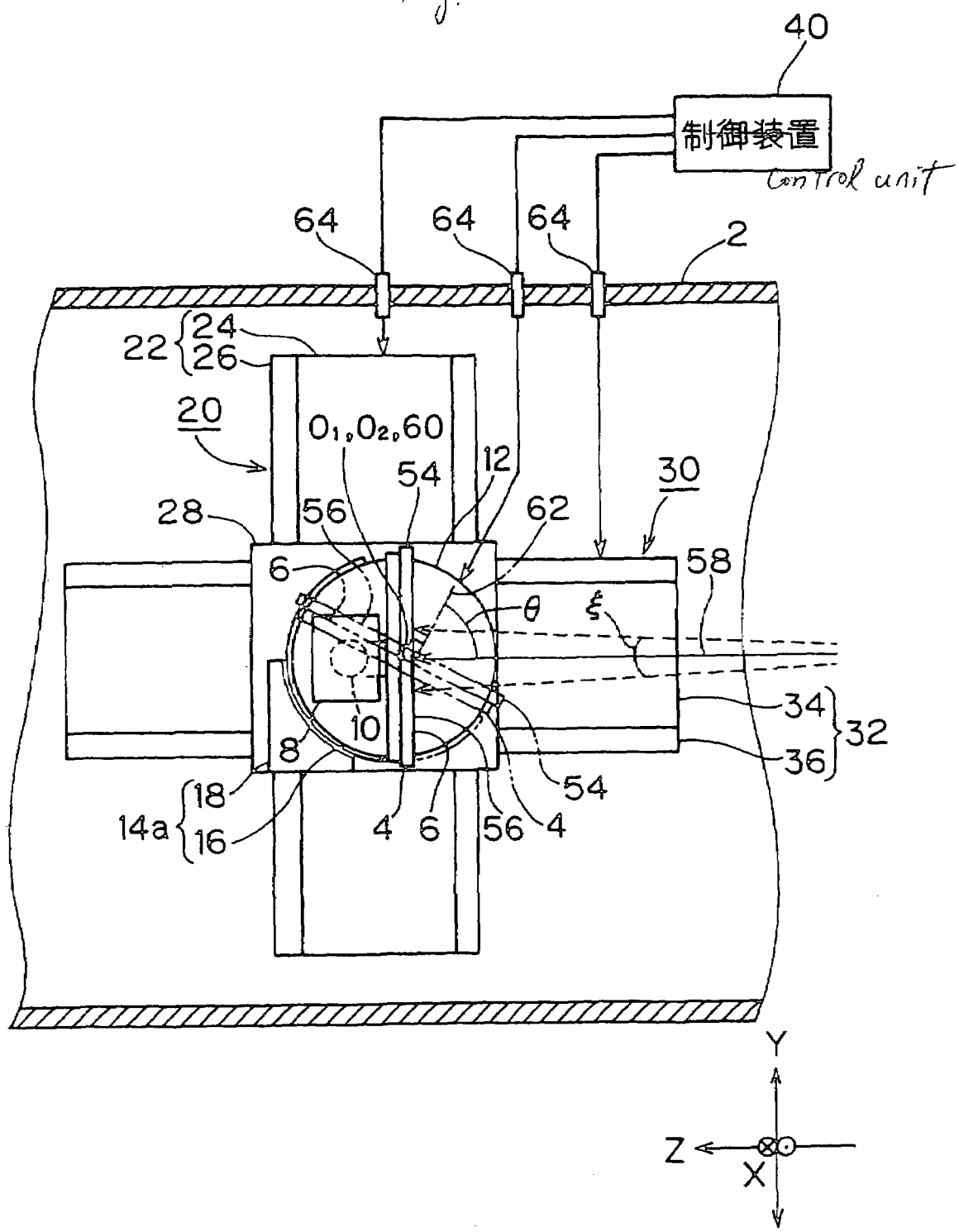
FIG. 2 is a schematic side view of the ion beam irradiation apparatus shown in FIG. 1.
Figure 4:
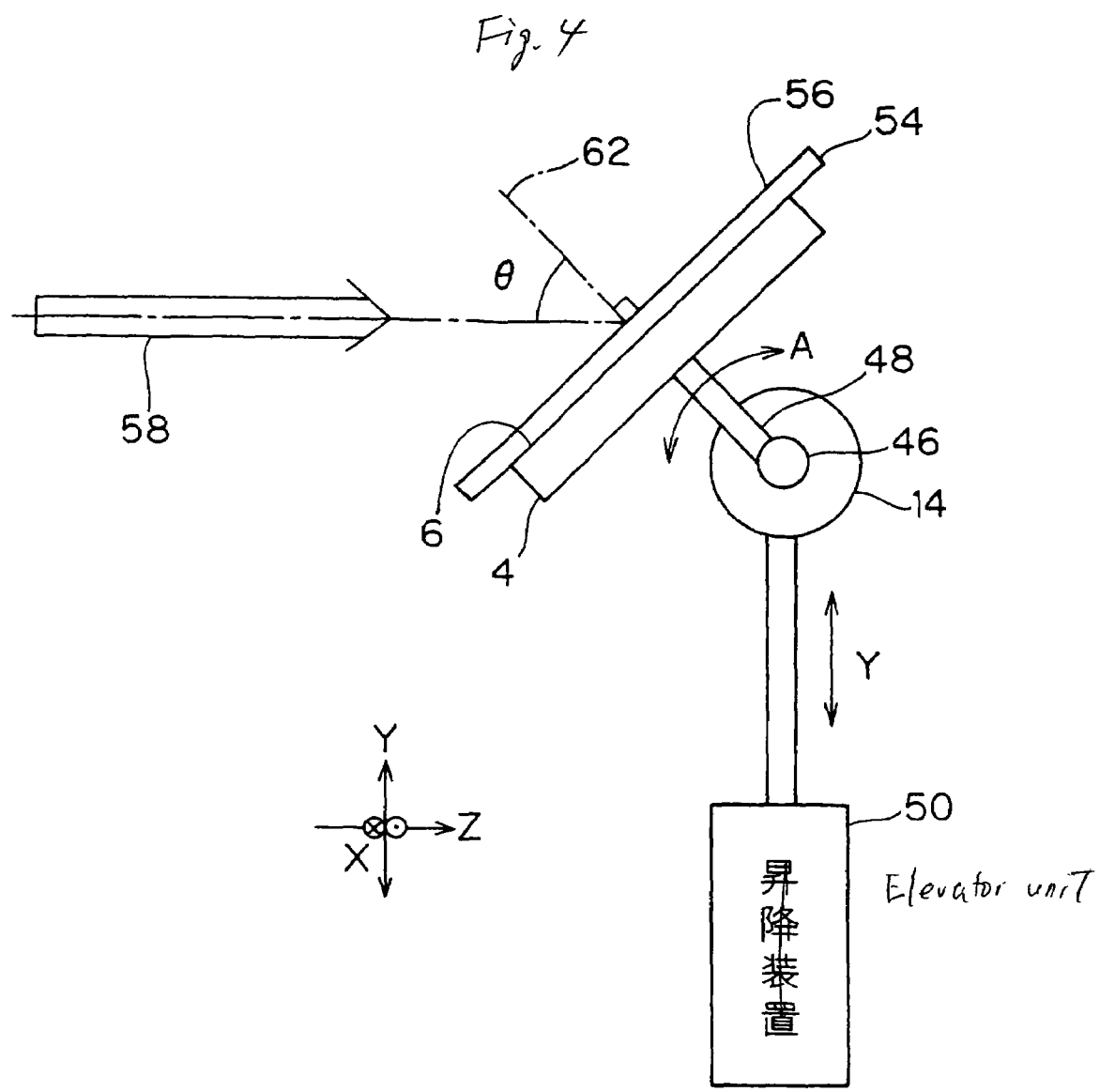
FIG. 4 is a schematic side view showing one example of a related-art ion beam irradiation apparatus.
Figure 5:
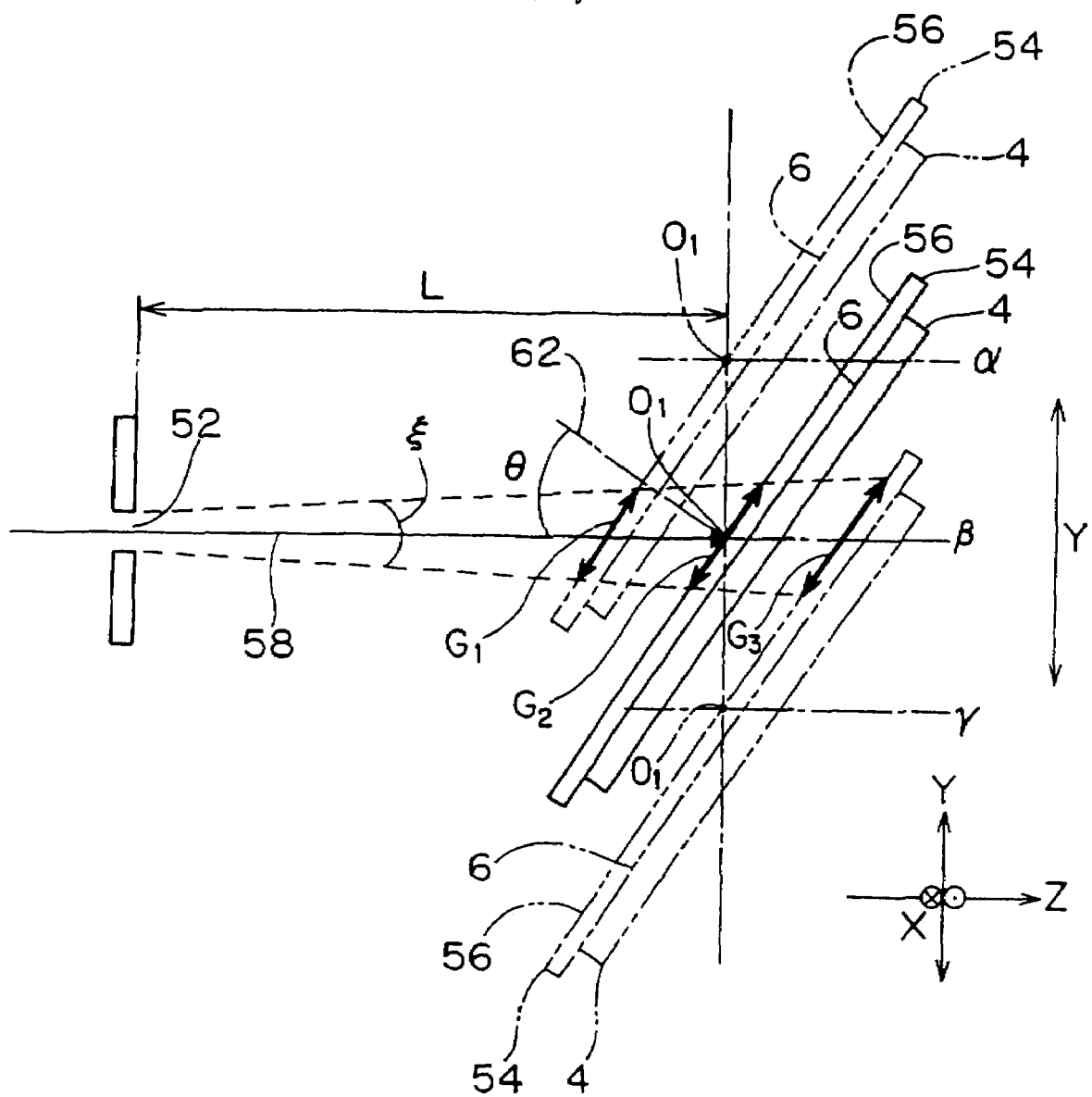
FIG. 5 is a side view of the ion beam irradiation apparatus shown in FIG. 4, which shows scan modes of a substrate during ion beam irradiation.

FIG. 1 is a schematically plan view showing one exemplary, non-limiting example of an ion beam irradiation apparatus according to this invention, and FIG. 2 is a schematically side view of the ion beam irradiation apparatus shown in FIG. 1. The same or corresponding parts as or to those in the related art shown in FIGS. 4 and 5 are denoted by the same reference numerals, and the different points from the related art will be mainly described below.

In this ion beam irradiation apparatus, an arm 8 for supporting a holder 4 is supported by a disc-shaped turn table 12. At this time, a center $O_2$ of the turn table 12 is on an imaginary center axis 60 that passes through a center $O_1$ of a substrate holding surface 6 of the holder 4 and is substantially parallel to an X-axis (refer to FIG. 1). The shown substrate 54, though it has the same thickness as thickness of the holder 4 for convenience, is very thin actually. Therefore, it can be said that the center axis 60 substantially passes through a surface 56 of the substrate 54.

This turn table 12 turns around the center axis 60.

Further, in this ion beam irradiation apparatus, an orientation flat angle control motor 10, which is not an essential component, is incorporated in the arm 8. Hereby, step implantation in which an orientation flat angle is changed every time the holder 4, that is, the substrate 54 is scanned once with respect to an irradiation direction Z of the ion beam 58 thereby to perform ion implantation can be executed.

Here, the "orientation flat angle" indicates an angle with respect to the predetermined direction, which is made by an orientation flat (that is, a notch (not shown)) formed in the substrate 54.

Further, this ion beam irradiation apparatus includes, in place of the related-art counter-rotatable type of irradiation angle setting motor 14 and the elevator unit 50 (refer to FIG. 4), includes a counter-movable type of irradiation angle setting motor 14a and a counter-movable type of Y-axis linear motor 20.

The irradiation angle setting motor 14a includes an irradiation angle setting mover 16 which is coupled to the turn-table 12, and an irradiation angle setting stator 18 which is opposed to this irradiation angle setting mover 16 and fixed to a Y-axis mover 28.

The irradiation angle setting mover 16 is provided for a part of the peripheral portion of the turn table 12, and formed in the shape of a fan along the peripheral surface of the turn table 12, viewed in the direction of the X-axis (refer to FIG. 2).

When the irradiation angle setting motor 14a rotates the turn table 12 around the center axis 60, the holder 4 supported through the arm 8 by the turn table 12 is rotated around the center axis 60. Thus, the irradiation angle θ (refer to FIG. 2) of the ion beam 58 with respect to the substrate holding surface 6 of the holder 4, that is, the surface 56 of the substrate 54 can be set. The irradiation angle θ shown in FIG. 2 is an angle with respect to the surface 56 of the substrate 54 which is shown by a chain double-dashed line.

The Y-axis linear motor 20 includes a Y-axis stator 22 and a Y-axis mover 28 opposed to this Y-axis stator 22.

The Y-axis stator 22 includes a fixing plate 24 that is long in the direction along the Y-axis, and a guide rail 26 that is fixed to this fixing plate 24 and long in the direction along the Y-axis.

The Y-axis mover 28 supports the irradiation angle setting motor 14a, and ascends and descends linearly along the guide rail 26.

Therefore, when the Y-axis mover 28 ascends and descends in the direction along the Y-axis, the holder 4 and the irradiation angle setting motor 14a ascend and descend linearly with the movement of the mover 28 in the direction along the Y-axis.

Further, this ion beam irradiation apparatus includes a counter-movable type of Z-axis linear motor 30.

This Z-axis linear motor 30 includes a Z-axis stator 32, and a Z-axis mover 38 (refer to FIG. 1) opposed to this Z-axis stator 32. However, the Y-axis stator 22 and the Z-axis mover 38, and more particularly the fixing plate 24 and the Z-axis mover 38 may be formed as one member to hold these functions simultaneously.

The Z-axis stator 32 includes a fixing plate 34 that is long in the direction along the Z-axis, and a guide rail 36 that is fixed to this fixing plate 34 and long in the direction along the Z-axis.

In this embodiment, though the fixing plate 34 is fixed to a vacuum chamber 2 and supported as shown in FIG. 1, for example, a table for fixing the fixing plate 34 may be set in the vacuum chamber 2.

The Z-axis mover 38 (refer to FIG. 1) supports the Y-axis linear motor 20, and more particularly the fixing plate 24, and moves linearly along the guide rail 36 in the direction along the Z-axis.

Therefore, when the Z-axis mover 38 (refer to FIG. 1) moves in the direction along the Z-axis, the holder 4, the irradiation angle setting motor 14a and the Y-axis linear motor 20 move linearly with this movement in the direction along the Z-axis.

The irradiation angle setting motor 14a, the Y-axis linear motor 20 and the Z-axis linear motor 30 are arranged in the vacuum chamber 2 that is kept in a vacuum state.

As shown in FIG. 2, on the outside of the vacuum chamber 2, a control unit 40 is provided. This control unit 40 controls the irradiation angle setting motor 14a through a field through 64 penetrating a wall surface of the vacuum chamber 2, and is electrically connected to the Y-axis linear motor 20 and the Z-axis linear motor 30 through field throughs 64 so as to operation-control synchronously these motors.

The control unit 40, when the irradiation angle θ is set or input, causes the irradiation angle setting motor 14a to turn the turn table 12 so that the irradiation angle of the ion beam 58 with respect to the substrate holding surface 6 of the holder 4 becomes θ. Thereafter, the ion beam 58 is applied to the substrate 54 held by the holder 4. Hereby, the substrate 54 receives the ion implantation processing.

Figure 3:
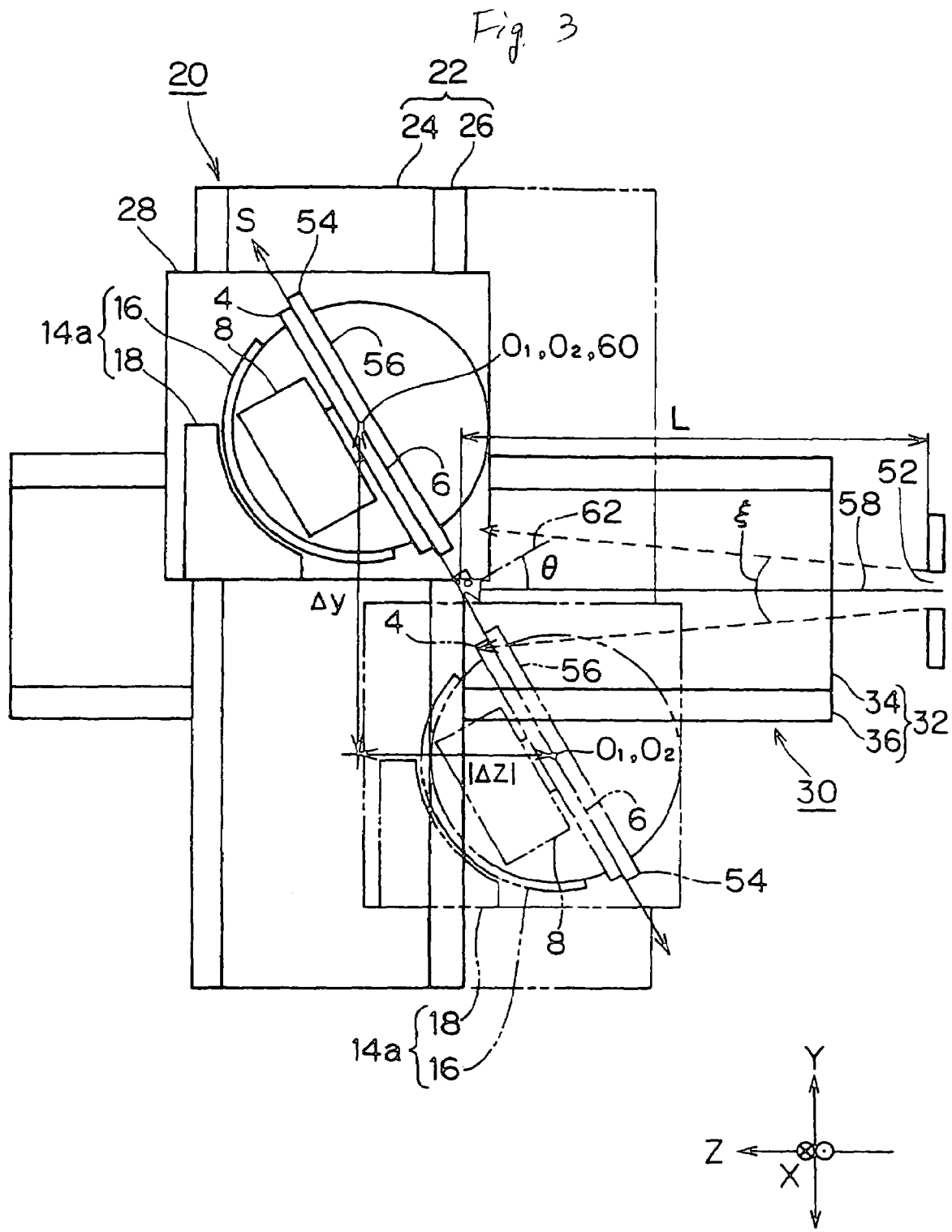
FIG. 3 is a schematic side view showing one exemplary, non-limiting example of operations of a Y-axis linear motor and a Z-axis linear motor.

Next, the operations of the Y-axis linear motor 20 and the Z-axis linear motor 30 controlled by the control unit 40 will be described with reference to FIG. 3.

When the distance by which the Y-axis liner motor 20 is caused to ascend in the direction along the Y-axis is taken as Δy, and the distance by which the Z-axis linear motor 30 is moved in the direction along the Z-axis is taken as Δz, the control unit 40 (refer to FIG. 2) operation-controls synchronously the Y-axis linear motor 20 and the Z-axis linear motor 30 so that the relation expression of Expression 1 is satisfied or the relation mathematically equivalent to this relation expression is satisfied.

$$\Delta z = \Delta y \tan \theta \quad \text{[Expression 1]}$$

On the other hand, when the distance by which the Y-axis liner motor 20 is caused to descend in the direction along the Y-axis is taken as Δy, and the distance by which the Z-axis linear motor 30 is moved in the direction along the Z-axis is taken as Δz, the control unit 40 (refer to FIG. 2) operation-controls synchronously the Y-axis linear motor 20 and the Z-axis linear motor 30 so that the relation expression of Expression 2 is satisfied or the relation mathematically equivalent to this relation expression is satisfied.

$$-\Delta z = \Delta y \tan \theta \quad \text{[Expression 2]}$$

The direction in which the ion beam 58 travels is taken as a positive direction of the Z-axis, and the opposite direction to that direction is taken as a negative direction of the Z-axis.

Further, the "distance by which the Y-axis linear motor 20 is caused to ascend in the direction along the Y-axis", and the "distance by which the Z-axis linear motor 30 is moved in the direction along the Z-axis" are specifically "distance by which the Y-axis mover 28 is caused to ascend in relation to the Y-axis stator 22 in the direction along the Y-axis", and "distance by which the Z-axis mover 38 (refer to FIG. 1) is moved in relation to the Z-axis stator 32 in the direction along the Z-axis", respectively.

When the control unit 40 (refer to FIG. 2) operation-controls synchronously the Y-axis linear motor 20 and the Z-axis linear motor 30 (namely, when the control unit 40 operates the both motors 20 and 30 substantially simultaneously, the holder 4 reciprocates and scans linearly so that the substrate holding surface 6 of the holder 4is along an S-axis.

The "S-axis" is a direction that is substantially parallel to the substrate holding surface 6 of the holder 4 and substantially orthogonal to the X-axis. Further, "substantially orthogonal" includes an orthogonal state.

Therefore, even if the holder 4, that is, the substrate 54 is scanned in a tiling state in the irradiation direction Z of the ion beam 58, the distance L from an arbitrary point (for example, an exit point of the beam slit 52) on the path of the ion beam 58 to the surface 56 of the substrate 54 becomes substantially constant. In result, the area of the irradiation region of the ion beam 58 applied onto the surface 56 of the substrate 54 becomes always substantially constant. Therefore, it is possible to prevent the density of the ion beam 58 applied onto the surface 56 of the substrate 54 from becoming non-uniform. Thus, uniformity of the ion implantation in the surface 56 of the substrate 54 improves.

Further, since the holder 4 can be moved in the direction along the Y-axis and in the direction along the Z-axis, and can be turned around the center axis 60, the degree of freedom in transport of the substrate 54 improves. Namely, the substrate 54 can be moved to the position where the substrate 54 is easy to be transported.

Further, it is also thought that using a ball screw, the holder 4 and the substrate 54 are scanned in the tilting state in the irradiation direction Z of the ion beam 58. However, as the case in this embodiment, the use of the Y-axis linear motor 20 and the Z-axis linear motor 30 can simplify the structure more while keeping the accuracy. Further, this case can prevent occurrence of particles (contaminants) from the screw portion.

Further, since both the center $O_1$ of the substrate holding surface 6 of the holder 4 and the center $O_2$ of the turn table 12 are on the center axis 60, by only turning the turn table 12 around the center axis 60, the irradiation angle θ can be set. Namely, it is not necessary to operate the Y-axis linear motor 20 or the Z-axis linear motor 30. Therefore, the control becomes easy, the structure can be simplified and the cost can be reduced.

However, even in case that the center $O_2$ of the turn table 12 is shifted from the center axis 60, the object of the invention can be achieved. Namely, in case that the center $O_2$ of the turn table 12 is shifted from the center axis 60, when the turn table 12 is turned, though the position of the holder 4 in the directions along the Y-axis and the Z-axis changes, this position change can be corrected by the Y-axis linear motor 20 and the Z-axis linear motor 30.

In the embodiment, the irradiation angle setting motor 14a is supported by the Y-axis linear motor, and this Y-axis linear motor is supported by the Z-axis linear motor. However, the invention is not limited to this.

For example, the Y-axis linear motor 20 and the Z-axis linear motor 30 may be replaced. Namely, the irradiation angle setting motor 14a may be supported by the Z-axis linear motor 30, and this Z-axis linear motor 30 may be supported by the Y-axis linear motor 20. In this case, the Z-axis linear motor 30 moves the holder 4 and the irradiation angle setting motor 14a in the direction along the Z-axis. The Y-axis linear motor 20 is fixed to the vacuum chamber 2, and causes the holder 4, the irradiation angle setting motor 14a and the Z-axis linear motor 30 to ascend and descend in the direction along the Z-axis.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

I claim:

1. An ion beam irradiation apparatus which scans, when three axes that are orthogonal to each other at one point are taken as an X-axis, a Y-axis and a Z-axis, in a direction along the X-axis, an ion beam traveling in a direction along the Z-axis, and applies the ion beam onto a substrate held by a substrate holding surface of a holder, comprising:
    an irradiation angle setting motor which holds the holder, and sets an irradiation angle of the ion beam with respect to the substrate holding surface by rotating the holder around a center axis that is substantially parallel to the X-axis;
    a Y-axis linear motor which supports the irradiation angle setting motor, and causes the holder and the irradiation angle setting motor to ascend and descend in a direction along the Y-axis;
    a Z-axis linear motor which supports the Y-axis linear motor, and moves the holder, the irradiation angle setting motor and the Y-axis linear motor in the direction along the Z-axis; and
    a control unit which operation-controls synchronously the Y-axis linear motor and the Z-axis linear motor so that the substrate holding surface of the holder reciprocates and scans linearly along an S-axis that is substantially parallel to the substrate holding surface and substantially orthogonal to the X-axis.

2. An ion beam irradiation apparatus which scans, when three axes that are orthogonal to each other at one point are taken as an X-axis, a Y-axis and a Z-axis, in a direction along the X-axis, an ion beam traveling in a direction along the Z-axis, and applies the ion beam onto a substrate held by a substrate holding surface of a holder, comprising:

an irradiation angle setting motor which holds the holder, and sets an irradiation angle of the ion beam with respect to the substrate holding surface by rotating the holder around a center axis that is substantially parallel to the X-axis;

a Z-axis linear motor which supports the irradiation angle setting motor, and moves the holder and the irradiation angle setting motor in the direction along the Z-axis;

a Y-axis linear motor which supports the Z-axis linear motor, and causes the holder, the irradiation angle setting motor and the Z-axis linear motor to ascend and descend in a direction along the Y-axis; and a control unit which operation-controls synchronously the Z-axis linear motor and the Y-axis linear motor so that the substrate holding surface of the holder reciprocates and scans linearly along an S-axis that is substantially parallel to the substrate holding surface and substantially orthogonal to the X-axis.

3. An ion beam irradiation apparatus which applies, when three axes that are orthogonal to each other at one point are taken as an X-axis, a Y-axis and a Z-axis, an ion beam that is long in the shape of a strip in a direction along the X-axis and travels in a direction along the Z-axis, onto a substrate held by a substrate holding surface of a holder, comprising:

an irradiation angle setting motor which holds the holder, and sets an irradiation angle of the ion beam with respect to the substrate holding surface by rotating the holder around a center axis that is substantially parallel to the X-axis;

a Y-axis linear motor which supports the irradiation angle setting motor, and causes the holder and the irradiation angle setting motor to ascend and descend in a direction along the Y-axis;

a Z-axis linear motor which supports the Y-axis linear motor, and moves the holder, the irradiation angle setting motor and the Y-axis linear motor in the direction along the Z-axis; and a control unit which operation-controls synchronously the Y-axis linear motor and the Z-axis linear motor so that the substrate holding surface of the holder reciprocates and scans linearly along an S-axis that is substantially parallel to the substrate holding surface and substantially orthogonal to the X-axis.

4. An ion beam irradiation apparatus which applies, when three axes that are orthogonal to each other at one point are taken as an X-axis, a Y-axis and a Z-axis, an ion beam that is long in the shape of a strip in a direction along the X-axis and travels in a direction along the Z-axis, onto a substrate held by a substrate holding surface of a holder, comprising:

an irradiation angle setting motor which holds the holder, and sets an irradiation angle of the ion beam with respect to the substrate holding surface by rotating the holder around a center axis that is substantially parallel to the X-axis;

a Z-axis linear motor which supports the irradiation angle setting motor, and moves the holder and the irradiation angle setting motor in the direction along the Z-axis;

a Y-axis linear motor which supports the Z-axis linear motor, and causes the holder, the irradiation angle setting motor and the Z-axis linear motor to ascend and descend in a direction along the Y-axis; and a control unit which operation-controls synchronously the Z-axis linear motor and the Y-axis linear motor so that the substrate holding surface of the holder reciprocates and scans linearly along an S-axis that is substantially parallel to the substrate holding surface and substantially orthogonal to the X-axis.

5. The ion beam irradiation apparatus according to claim 1, wherein the control unit operation-controls synchronously the Y-axis linear motor and the Z-axis linear motor so that: when the control unit causes the Y-axis linear motor to ascend along the Y-axis by the distance $\Delta y$, the relation of $\Delta z = \Delta y \tan \theta$ is satisfied or the relation mathematically equivalent to this relation is satisfied; and when the control unit causes the Y-axis linear motor to descend along the Y-axis by the distance $\Delta y$, the relation of $-\Delta z = \Delta y \tan \theta$ is satisfied or the relation mathematically equivalent to this relation is satisfied, in which $\theta$ represents an irradiation angle of the ion beam applied to the substrate, and $\Delta z$ represents distance by which the Z-axis linear motor is moved along the Z-axis if the direction in which the ion beam travels is taken as a positive direction.

6. The ion beam irradiation apparatus according to claim 2, wherein the control unit operation-controls synchronously the Y-axis linear motor and the Z-axis linear motor so that: when the control unit causes the Y-axis linear motor to ascend along the Y-axis by the distance $\Delta y$, the relation of $\Delta z = \Delta y \tan \theta$ is satisfied or the relation mathematically equivalent to this relation is satisfied; and when the control unit causes the Y-axis linear motor to descend along the Y-axis by the distance $\Delta y$, the relation of $-\Delta z = \Delta y \tan \theta$ is satisfied or the relation mathematically equivalent to this relation is satisfied, in which $\theta$ represents an irradiation angle of the ion beam applied to the substrate, and $\Delta z$ represents distance by which the Z-axis linear motor is moved along the Z-axis if the direction in which the ion beam travels is taken as a positive direction.

7. The ion beam irradiation apparatus according to claim 3, wherein the control unit operation-controls synchronously the Y-axis linear motor and the Z-axis linear motor so that: when the control unit causes the Y-axis linear motor to ascend along the Y-axis by the distance $\Delta y$, the relation of $\Delta z = \Delta y \tan \theta$ is satisfied or the relation mathematically equivalent to this relation is satisfied; and when the control unit causes the Y-axis linear motor to descend along the Y-axis by the distance $\Delta y$, the relation of $-\Delta z = \Delta y \tan \theta$ is satisfied or the relation mathematically equivalent to this relation is satisfied, in which $\theta$ represents an irradiation angle of the ion beam applied to the substrate, and 66 z represents distance by which the Z-axis linear motor is moved along the Z-axis if the direction in which the ion beam travels is taken as a positive direction.

8. The ion beam irradiation apparatus according to claim 4, wherein the control unit operation-controls synchronously the Y-axis linear motor and the Z-axis linear motor so that: when the control unit causes the Y-axis linear motor to ascend along the Y-axis by the distance $\Delta y$, the relation of $\Delta z = \Delta y \tan \theta$ is satisfied or the relation mathematically equivalent to this relation is satisfied; and when the control unit causes the Y-axis linear motor to descend along the Y-axis by the distance $\Delta y$, the relation of $-\Delta z = \Delta y \tan \theta$ is satisfied or the relation mathematically equivalent to this relation is satisfied, in which $\theta$ represents an irradiation angle of the ion beam applied to the substrate, and $\Delta z$ represents distance by which the Z-axis linear motor is moved along the Z-axis if the direction in which the ion beam travels is taken as a positive direction.

* * * * *